(12) United States Patent
Zandman et al.

(10) Patent No.: US 6,316,287 B1
(45) Date of Patent: Nov. 13, 2001

(54) CHIP SCALE SURFACE MOUNT PACKAGES FOR SEMICONDUCTOR DEVICE AND PROCESS OF FABRICATING THE SAME

(75) Inventors: Felix Zandman, Bala Cynwyd, PA (US); Y. Mohammed Kasem, Santa Clara; Yueh-Se Ho, Sunnyvale, both of CA (US)

(73) Assignee: Vishay Intertechnology, Inc., Malvern, PA (US)

( * ) Notice: Subject to any disclaimer, the term of this patent is extended or adjusted under 35 U.S.C. 154(b) by 0 days.

(21) Appl. No.: 09/395,094

(22) Filed: Sep. 13, 1999

(51) Int. Cl.⁷ .................. H01L 21/44; H01L 21/48; H01L 21/50
(52) U.S. Cl. .................. 438/113; 438/114; 438/460; 438/462; 438/464; 438/465; 438/928
(58) Field of Search ............................ 438/113, 114, 438/460, 462, 464, 465, 428

(56) References Cited

U.S. PATENT DOCUMENTS

| | | | |
|---|---|---|---|
| 5,270,261 | 12/1993 | Bertin et al. | 437/209 |
| 5,753,529 | 5/1998 | Chang et al. | 437/67 |
| 5,757,081 | 5/1998 | Chang et al. | 257/778 |
| 5,767,578 | 6/1998 | Chang et al. | 257/717 |
| 5,888,884 | * 3/1999 | Wojnarowski | 438/462 |
| 5,998,238 | * 12/1999 | Kosaki | 438/114 |
| 6,153,448 | * 11/2000 | Takahashi et al. | 438/114 |
| 6,159,767 | * 12/2000 | Eichelberger | 438/107 |

FOREIGN PATENT DOCUMENTS

WO 98/19337  5/1998  (WO) .............. H01L/21/44

OTHER PUBLICATIONS

Lawrence Kren, "The Race For Less Space", Machine Design, Jul. 8, 1999, pp. 86–89.

Patrick Mannion, "MOSFETs Break Out Of The Shackles Of Wirebonding", Electronic Design, Mar. 22, 1999, vol. 47, No. 6, pp. 1–5.

* cited by examiner

*Primary Examiner*—John F. Niebling
*Assistant Examiner*—David A. Zarneke

(57) ABSTRACT

A package for a semiconductor device is formed by a process which includes forming a metal layer in contact with a connection pad on the front side of a semiconductor die while the die is still a part of a wafer. The metal layer extends into the scribe line between the die and an adjacent die. A nonconductive cap is attached to the front side of the wafer, and the wafer is ground from its back side to reduce its thickness. A cut is made from the back side of the wafer, preferably by sawing and etching, to expose the metal layer. A nonconductive layer is formed on the back side of the wafer and a second metal layer is deposited over the nonconductive layer, the second metal layer extending into the scribe line where it makes contact with the first metal layer through an opening in the nonconductive layer. Preferably, a solder post is formed on the second metal layer to allow the finished package to be mounted on a printed circuit board. The cap is then sawed along the scribe line with a saw whose kerf is small enough not to sever the contact between the metal layers. The dice are thereby completely detached from each other, forming individual semiconductor device packages.

43 Claims, 13 Drawing Sheets

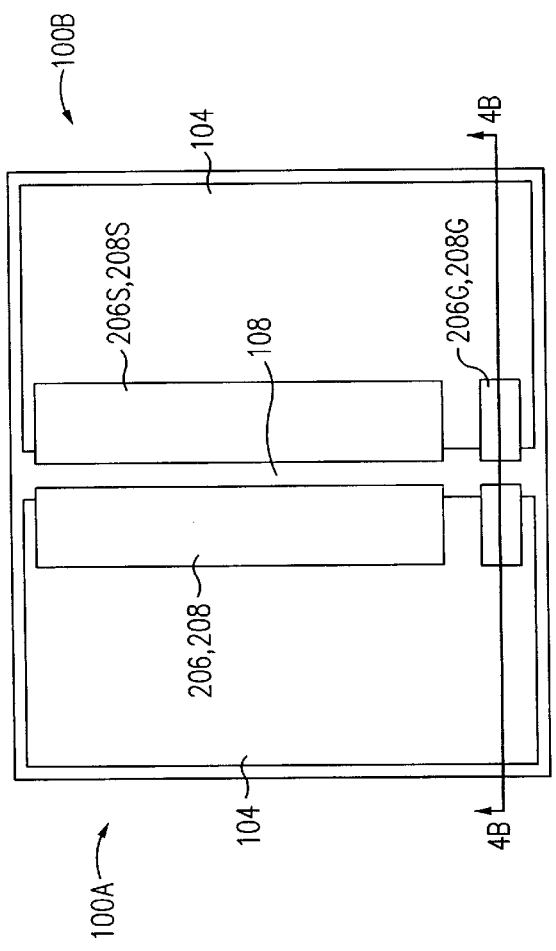
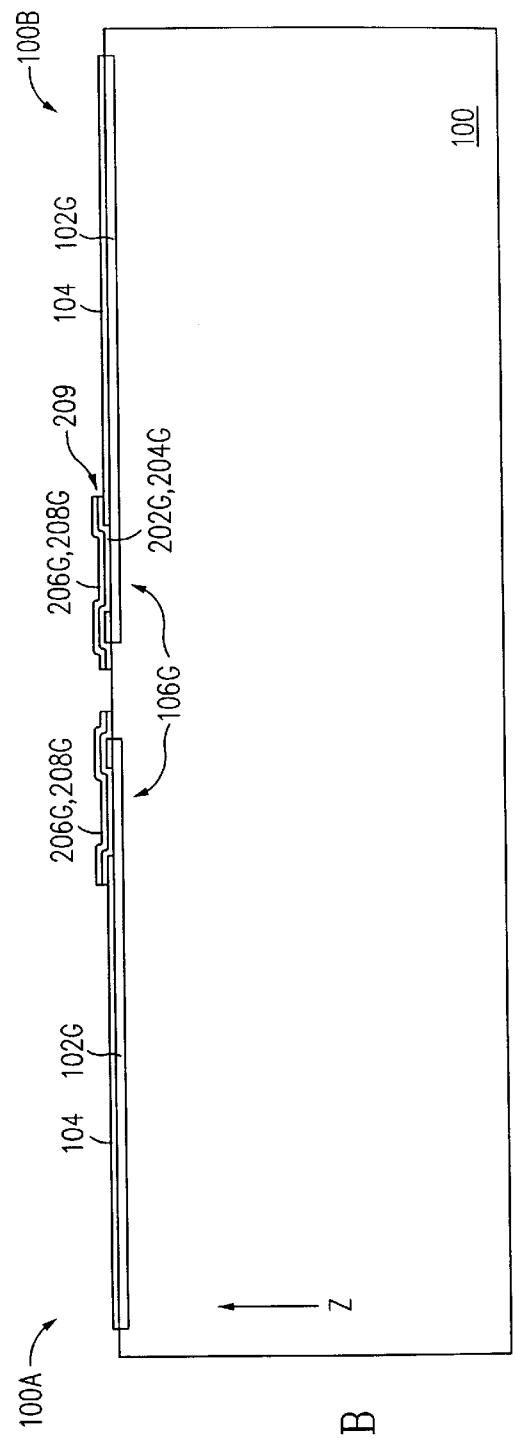
FIG. 4A
FIG. 4B

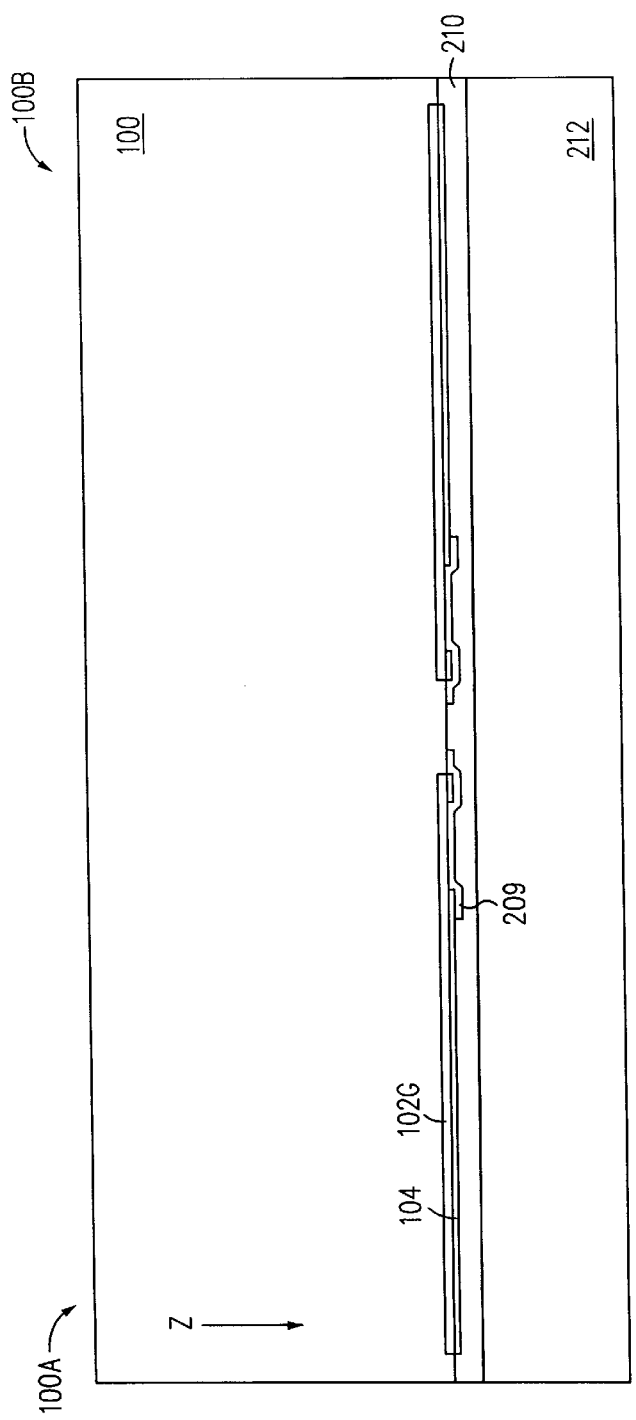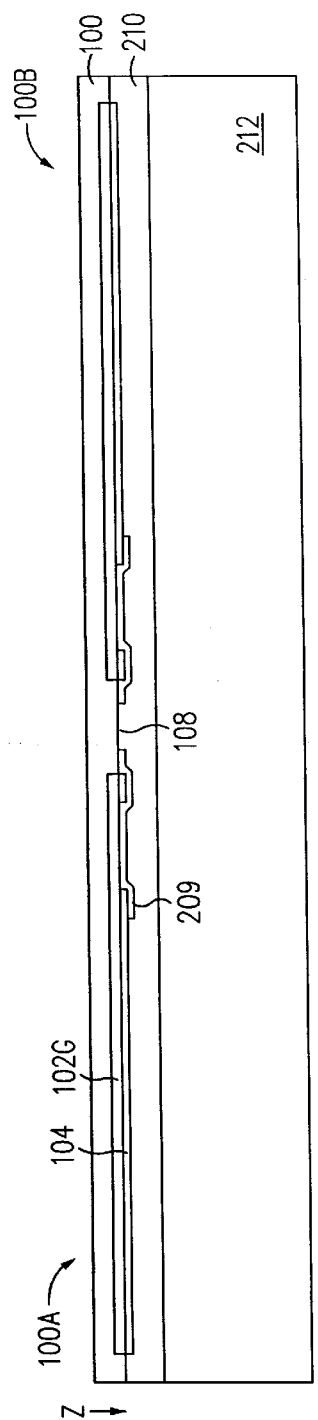

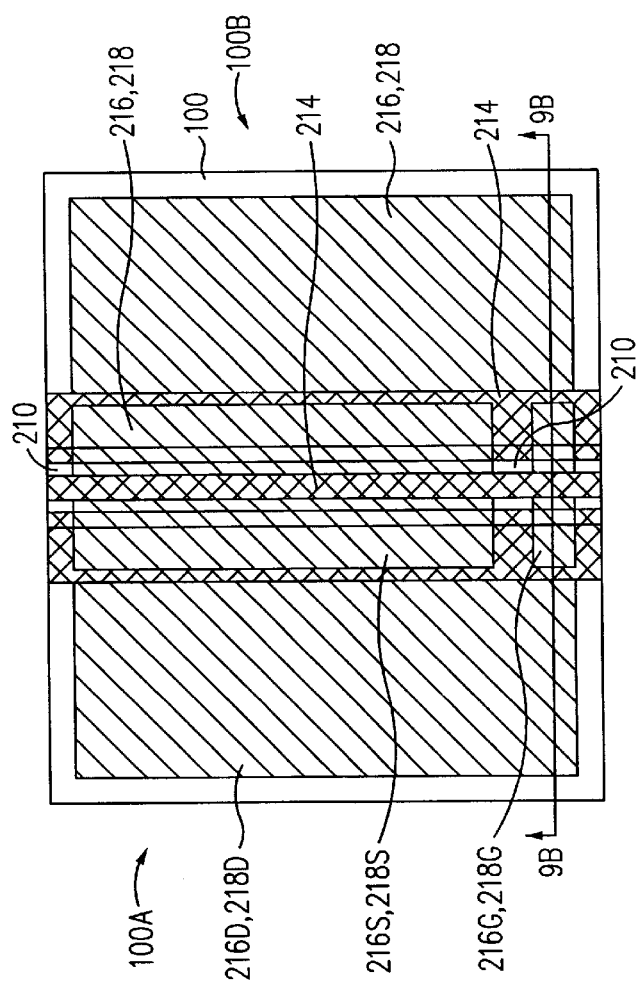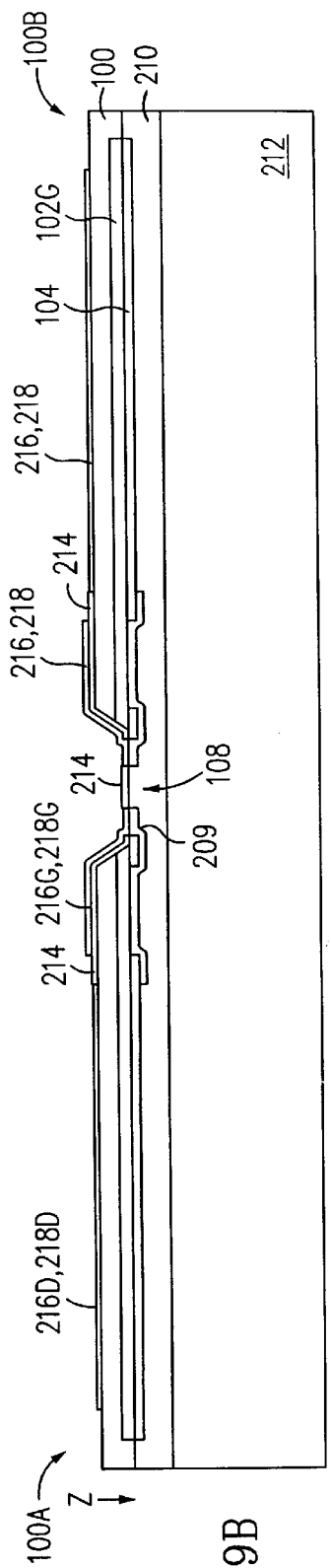
FIG. 9A
FIG. 9B

CHIP SCALE SURFACE MOUNT PACKAGES FOR SEMICONDUCTOR DEVICE AND PROCESS OF FABRICATING THE SAME

CROSS-REFERENCE TO RELATED APPLICATIONS

This application is related to application Ser. No. 09/395,095 and application Ser. No. 09/395,097, both of which were filed by the same applicants on the same date as this application and both of which are incorporated herein by reference.

BACKGROUND OF THE INVENTION

After the processing of a semiconductor wafer has been completed, the resulting integrated circuit (IC) chips or dice must be separated and packaged in such a way that they can be connected to external circuitry. There are many known packaging techniques. Most involve mounting the die on a leadframe, connecting the die pads to the leadframe by wire-bonding or otherwise, and then encapsulating the die and wire bonds in a plastic capsule, with the leadframe left protruding from the capsule. The encapsulation is often done by injection-molding. The leadframe is then trimmed to remove the tie bars that hold it together, and the leads are bent in such a way that the package can be mounted on a flat surface, typically a printed circuit board (PCB).

This is generally an expensive, time-consuming process, and the resulting semiconductor package is considerably larger than the die itself, using up an undue amount of scarce "real estate" on the PCB. In addition, wire bonds are fragile and introduce a considerable resistance between the die pads and the leads of the package.

The problems are particularly difficult when the device to be packaged is a "vertical" device, having terminals on opposite faces of the die. For example, a power MOSFET typically has its source and gate terminals on the front side of the die and its drain terminal on the back side of the die. Similarly, a vertical diode has its anode terminal on one face of the die and its cathode terminal on the opposite face of the die. Bipolar transistors, junction field effect transistors (JFETs), and various types of integrated circuits (ICs) can also be fabricated in a "vertical" configuration.

Accordingly, there is a need for a process which is simpler and less expensive than existing processes and which produces a package that is essentially the same size as the die. There is a particular need for such a process and package that can be used with semiconductor dice having terminals on both their front and back sides.

SUMMARY OF THE INVENTION

The process of fabricating a semiconductor device package in accordance with this invention begins with a semiconductor wafer having a front side and a back side and comprising a plurality of dice separated by scribe lines. Each die comprises a semiconductor device. A surface of the front side of each die comprises a passivation layer and at least one connection pad in electrical contact with a terminal of the semiconductor device. The back side of each die may also be in electrical contact with a terminal of the semiconductor device.

The process comprises the following steps: forming a first metal layer in electrical contact with the connection pad, a portion of the first metal layer extending laterally beyond an edge of the die; attaching a cap to the front side of the wafer; cutting through the semiconductor wafer from the back side of the wafer in the scribe line area to form a first cut, the first cut having a first kerf W1 and exposing a part of the first metal layer; forming a nonconductive layer on the back side of the die; forming a second metal layer, the second metal layer having a first section extending over the nonconductive layer and being in electrical contact with the first metal layer; and cutting through the cap in the scribe line area to form a second cut having a second kerf W2 that is less than the first kerf W1, the second cut leaving in place an area of contact between the first and second metal layers.

In many embodiments, the process also includes forming a second section of the second metal layer in electrical contact with the backside of the semiconductor wafer, the first and second sections of the second metal layer being electrically insulated from each other. The process may also include grinding, lapping or etching the back side of the semiconductor wafer to reduce the thickness of the wafer after attaching the cap to the front side of the wafer.

In one aspect, the invention includes a process for making an electrical connection between a first location on a first side of a semiconductor die and a second location on a second side of the semiconductor die. The process commences while the die is a part of a semiconductor wafer. The process comprises forming a first metal layer extending laterally from the first location on the first side of the die to an area of the wafer beyond an edge of the die; attaching a cap to the first side of the wafer; cutting through the semiconductor wafer from the second side of the wafer to expose a part of the first metal layer; forming a second metal layer extending laterally from the second location on the second side of the die and along an edge of the die to a region of contact with the first metal layer beyond the edge of the die; and cutting through the cap while leaving intact the region of contact between the first and second metal layers.

This invention also includes package for a semiconductor device. The package comprises a cap having a width X1; a semiconductor die containing a semiconductor device, the die being attached to the cap with a front side of the die facing the cap and a back side of the die facing away from the cap, the die having a width X2 that is less than X1; a connection pad in electrical contact with the semiconductor device, the contact being located between the die and the cap and having a width no greater than X2; a first metal layer in electrical contact with the connection pad, a first portion of the first metal layer being located between the connection pad and the cap and a second portion of the first metal layer extending laterally beyond an edge of the connection pad; a second metal layer having first and second sections, the first section of the second metal layer being in contact with the second portion of the first metal layer, the second section being in electrical contact with the backside of the wafer, the first and second sections of the second metal layer being electrically insulated from each other.

In yet another aspect, this invention includes a package for a semiconductor device comprising a semiconductor die containing a semiconductor device, a first side of the die comprising a connection pad; a cap attached to the first side of the die, an edge of the cap extending laterally beyond an edge of the die; a first metal layer in electrical contact with the connection pad, the first metal layer extending laterally and terminating in a first flange beyond an edge of the die; and a second metal layer extending from a second side of the die and along an edge of the die and terminating in a second flange beyond the edge of the die, the second flange being in contact with the first flange.

Semiconductor packages according to this invention do not require an epoxy capsule or bond wires; the substrate attached to the die serves to protect the die and acts as a heat sink for the die; the packages are very small (e.g., 50% the size of molded packages) and thin; they provide a very low on-resistance for the semiconductor device, particularly if the wafer is ground thinner; they are economical to produce, since they require no molds or lead frames; and they can be used for a wide variety of semiconductor devices such as diodes, MOSFETs, JFETs, bipolar transistors and various types of integrated circuit chips.

BRIEF DESCRIPTION OF THE DRAWINGS

This invention will be better understood by reference to the following drawings (not drawn to scale), in which similar components are similarly numbered.

FIGS. 2A–2B through 4A–4B, 5, 6, and 7A–7B through 12A–12B illustrate the steps of a process of fabricating a semiconductor package in accordance with this invention.

DESCRIPTION OF THE INVENTION

Figure 1:
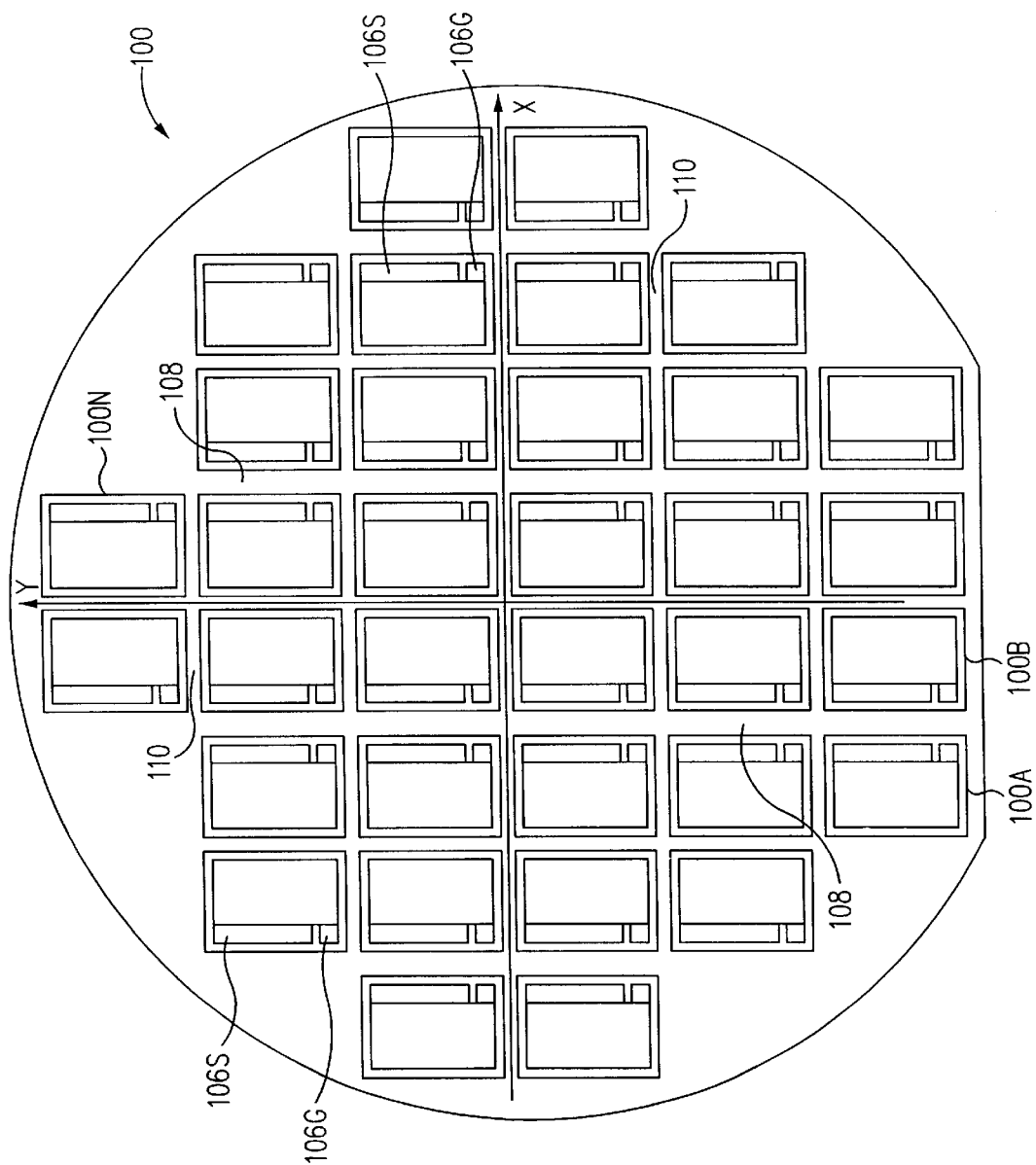
FIG. 1 illustrates a top view of a semiconductor wafer.

FIG. 1 shows a top view of a semiconductor wafer 100 which contains dice 100A, 100B through 100N. In reality, wafer 100 would contain hundreds or thousands of dice. The individual dice are separated by a perpendicular network of scribe lines, with scribe lines 108 running in the Y direction and scribe lines 110 running in the X direction. Metal pads for connecting to external circuit elements are located on the top surface of each of the dice 100A–100N. For example, since dice 100A–100N contain vertical power MOSFETs, each die has a source connection pad 106S and a gate connection pad 106G.

Wafer 100 is typically has a thickness in the range of 15–30 mils. Wafer 100 is typically silicon but it could also be another semiconductor material such as silicon carbide or gallium arsenide.

As described above, before dice 100A–100N can be used they must be packaged in a form that allows them to be connected to external circuitry.

The process of this invention is illustrated in FIGS. 2A–2B through 4A–4B, 5, 6, and 7A–7B through 12A–12B, which show dice 100A and 100B that are part of semiconductor wafer 100. In each drawing where applicable, the figure labeled "A" is taken from a top or bottom view of the wafer; the figure labeled "B" is a cross-sectional view taken at the section labeled "B—B" in the "A" figure. As described below, in the course of the process the wafer is attached to a "cap", the front side of the wafer normally facing the cap. In the finished package, the wafer is positioned under the cap, although at some points in the process the structure may be inverted, with the cap under the wafer. Unless the context clearly indicates otherwise, as used herein "above", "below", "over", "under" and other similar terms refer to the package in its finished form with the cap above the wafer.

This invention will be described with respect to a package for a vertical power MOSFET, which typically has source and gate terminals on its front side and a drain terminal on its back side. It should be understood, however, that the broad principles of this invention can be used to fabricate a package for any type of semiconductor die which has one or more terminals on both its front and back sides or on its front side alone. As used herein, the "front side" of a die or wafer refers to the side of the die or wafer on which the electrical devices and/or a majority of the connection pads are located; "back side" refers to the opposite side of the die or wafer. The directional arrow labeled "Z" points to the front side of the wafer and identifies the drawings in which the wafer is inverted.

Figure 2A:
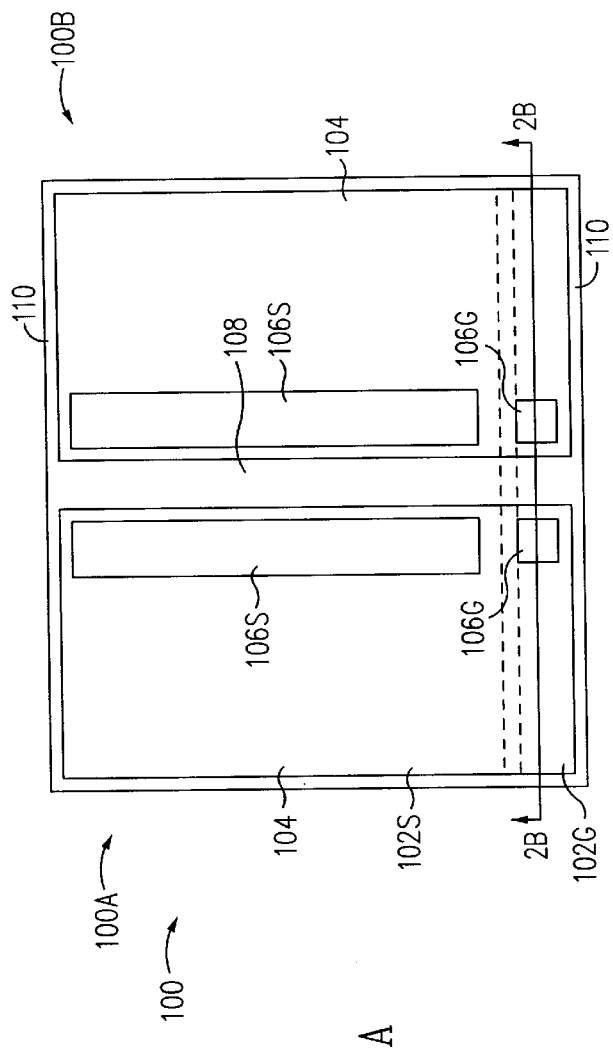
Figure 2B:
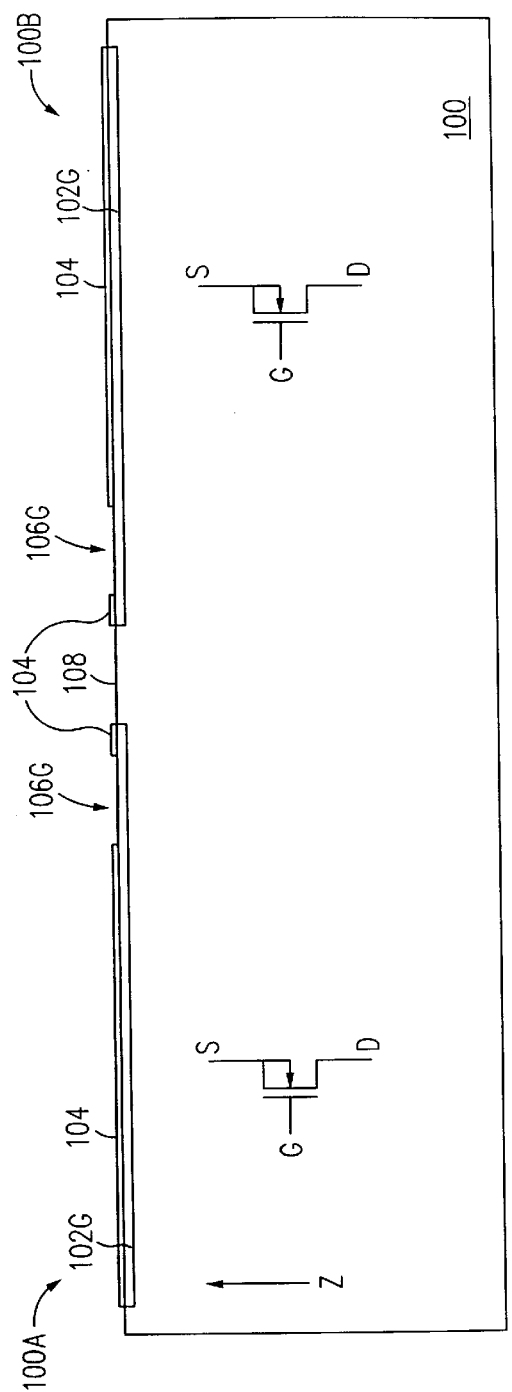

Referring to FIGS. 2A–2B, since dice 100A and 100B contain power MOSFETs (shown symbolically), each die has a gate metal layer 102G and a source metal layer 102S overlying the top surface of the silicon or other semiconductor material. Gate metal layers 102G and source metal layers 102S are in electrical contact with the gate and source terminals (not shown), respectively, of the power MOSFETs within dice 100A and 100B. In FIG. 2A, the separation between layers 102G and 102S is shown by the dashed lines.

Typically, metal layers 102G and 102S include aluminum, although copper layers are also being used. In most embodiments of this invention, metal layers 102G and 102S need to be modified so that they will adhere to a solder metal such as tin/lead, for the reasons described below. If there is a native oxide layer on the metal, this native oxide layer must first be removed. Then a solderable metal, such as gold, nickel or silver, is deposited on the exposed metal. The removal of the oxide layer and deposition of a solderable metal can be accomplished by means of a number of known processes. For example, an aluminum layer can be sputter-etched to remove the native aluminum oxide layer and then gold, silver or nickel can be sputtered onto the aluminum. Alternatively, the die can be dipped in a liquid etchant to strip away the oxide layer and the solderable metal can then be deposited by electroless or electrolytic plating. Electroless plating includes the use of a "zincating" process to displace the oxide, followed by the plating of nickel to displace the zincate.

In one embodiment metal layers 102G and 102S include a 3 μm sublayer of Al overlain by a 1,000 Å TiN sublayer and a 500 Å Ti sublayer.

A passivation layer 104 overlies a portion of gate metal layers 102G and source metal layers 102S, and openings in passivation layer 104 define gate connection pads 106G and source connection pads 106S. Passivation layer 104 can be formed of phosphosilicate glass (PSG) 1 mil thick, for example.

Dice 100A and 100B are separated by a Y-scribe line 108, which can be 6 mils wide. X-scribe lines 110 perpendicular to scribe line 108 at the top and bottom of dice 100A and 100B can be 4 mils wide.

Figure 3A:
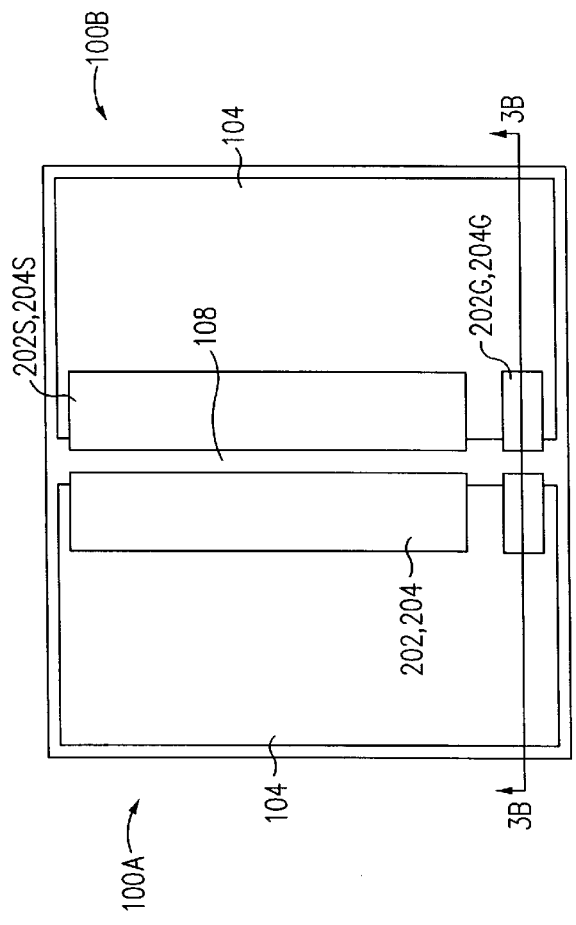
Figure 3B:
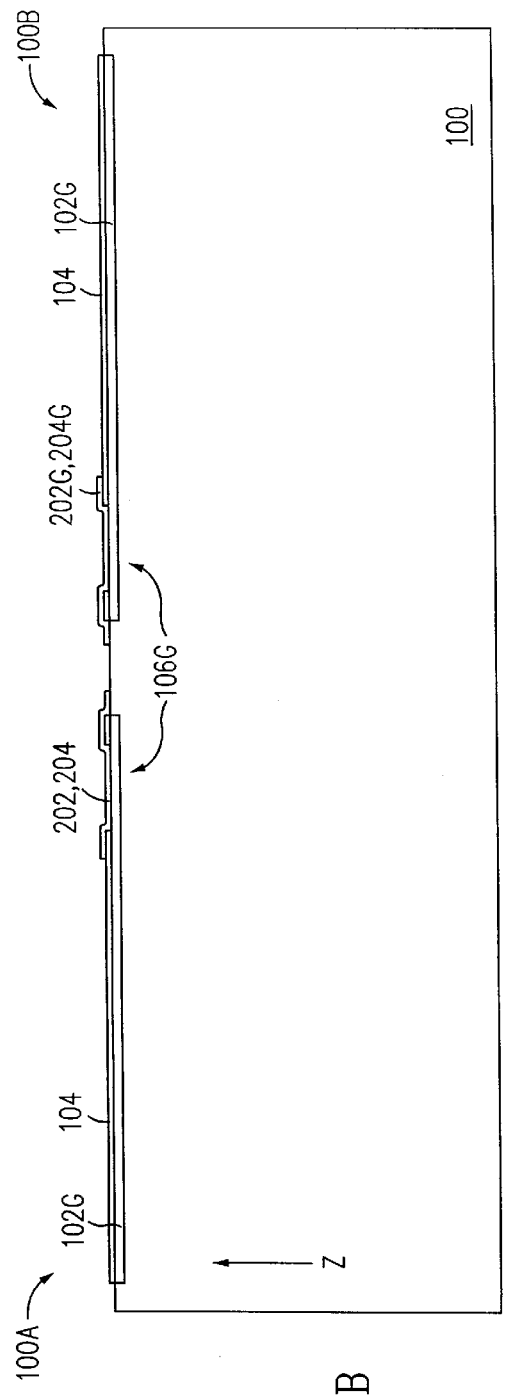

A sublayer 202 of titanium is sputtered onto the front side of wafer 100, and a sublayer 204 of aluminum is sputtered over the titanium sublayer 202. For example, titanium sublayer 202 may be 500 Å thick and aluminum sublayer 204 may be 3 μm thick. Sublayers 202 and 204 are then masked and etched, using conventional photolithographic and etching processes, so that the portions of sublayers 202 and 204 shown in FIGS. 3A–3B remain. Portions 202G, 204G of sublayers 202, 204 cover the gate connection pads 106G and portions 202S, 204S of sublayers 202, 204 cover the source connection pads 106S. Portions 202G, 204G are electrically insulated from portions 202S, 204S. As shown, the sublayers 202G, 202S and 204G, 204S extend laterally into the area of Y-scribe line 108.

A 10 μm nickel sublayer 206 is then plated electrolessly onto the top surface of aluminum sublayers 204G and 204S and a 0.1 μm gold sublayer 208 is plated on nickel sublayer 206. The resulting structure is shown in FIGS. 4A–4B, with portions 206G and 208G of sublayers 206 and 208, respectively, overlying gate connection pads 106G and portions 206S and 208S of sublayers 206 and 208, respectively, overlying source connection pads 106S. Portions 206G, 208G are electrically insulated from portions 206S, 208S.

Together sublayers 202, 204, 206 and 208 in each die form a first metal layer 209. In other embodiments, the first metal layer 209 can include fewer or more than four sublayers, and the sublayers can be deposited by any of the known processes such as sputtering, evaporation, electroless or electrolytic plating, stencil printing or screen-printing. Sublayers 202, 204, 206 and 208 will sometimes be referred to herein collectively as "first metal layer 209".

A cap 212 is attached to the front side of wafer 100 with a nonconductive adhesive layer 210. Layer 210 can be 25 $\mu$m thick and can be an epoxy. Cap 212 can be made of glass, plastic or copper and can be 250–500 $\mu$m thick. This structure is shown in FIG. 5, with wafer 100 being inverted from the previous drawings and cap 212 being shown below wafer 100.

As shown in FIG. 6, wafer 100 is then optionally ground from its back side to a thickness of 3–4 mils or as thin as is possible without damaging the internal microstructure of the semiconductor devices within the dice (which can be, for example, trench-gated MOSFETs). For example, a grinding machine available from Strausbaugh can be used. This is possible because of the support provided by cap 212. Grinding reduces the resistance to current flow from the front side to the back side of wafer 100.

As an alternative to grinding, wafer 100 can be thinned by lapping or etching the back side of the wafer.

Figure 7A:
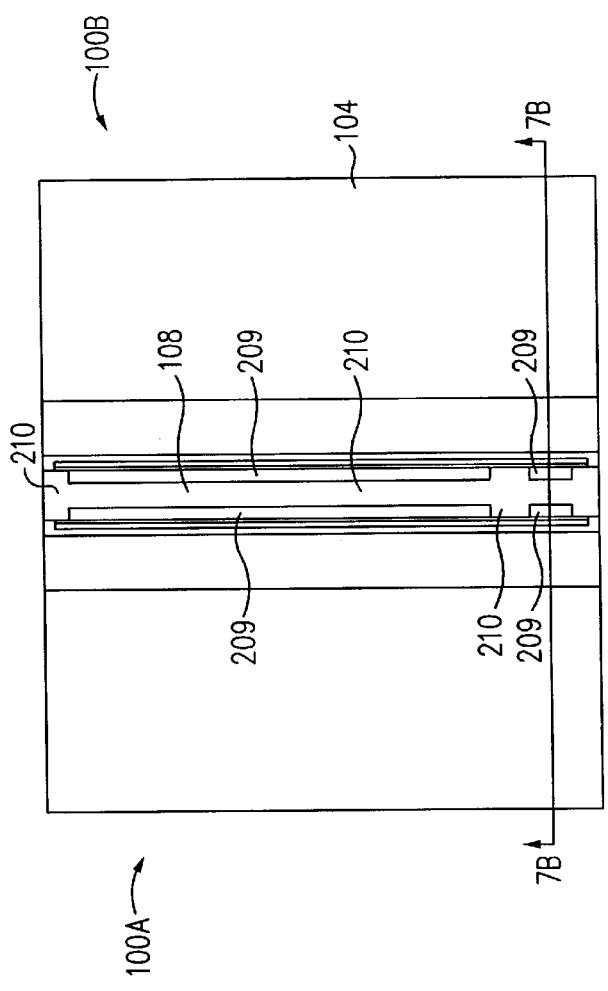
Figure 7B:
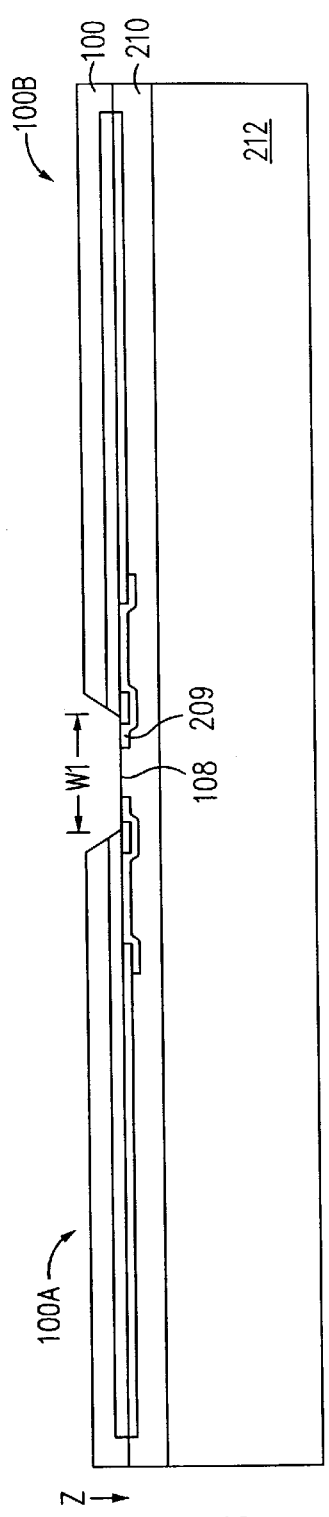

Preferably using a taper saw, a cut is then made along Y-scribe line 108 from the back side of wafer 100, leaving a thickness of about 1 mil of silicon at the location of the cut. The kerf of the saw cut is indicated as W1. The remaining thickness of silicon is then etched, using a known silicon etchant, to expose the portion of the first metal layer 209 that extends into the area of Y-scribe line 108. In this case, the titanium sublayer 202 is initially exposed. The cut does not extend all the way through the first metal layer 209 to the adhesive layer 210 and cap 212. The resulting structure is shown in FIGS. 7A and 7B.

Figure 8A:
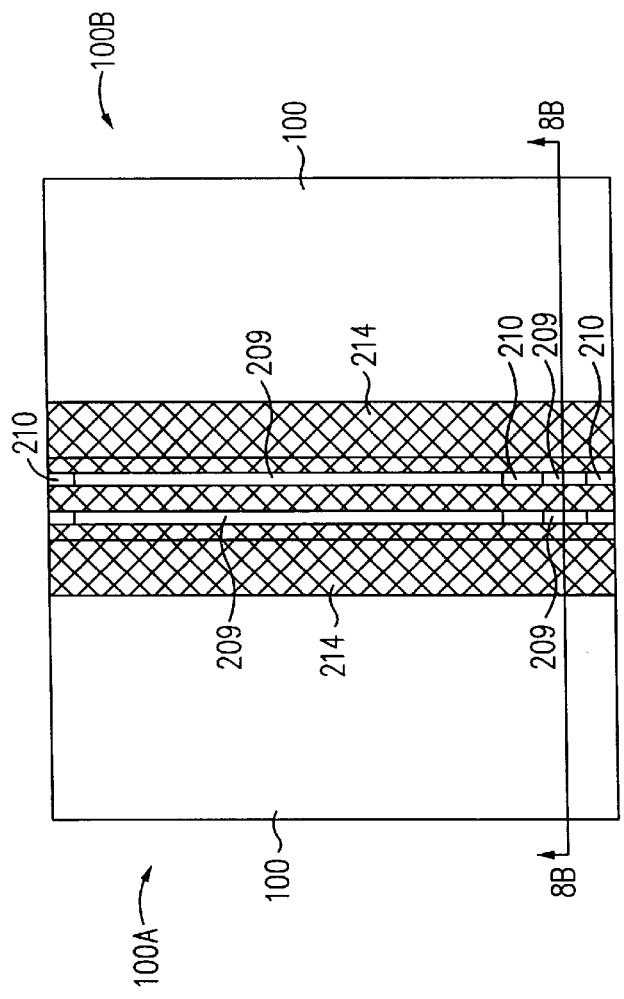
Figure 8B:
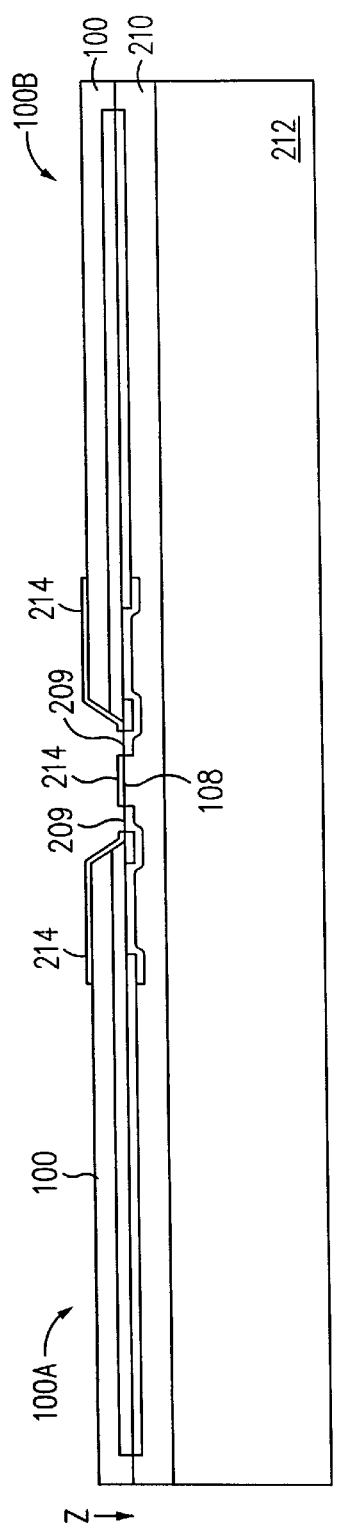

An insulating layer 214, which can be made of polyimide, PSG, nonconductive epoxy, or another nonconductive material, is deposited on the back side of wafer 100. Insulating layer 214 can be deposited by spin-coating, dispensing or screen-printing and can be 1 mil thick. Insulating layer 214 is masked and etched, using normal photolithographic and etching techniques, so that portions of insulating layer 214 overlying the first metal layer 209 and portions of the backside of the wafer 100 are removed, as shown in FIGS. 8A and 8B.

In some embodiments, particularly if the side of the wafer facing away from the cap is already covered by an insulating layer (e.g., a passivation layer), it may be possible to omit the deposition of an insulating layer.

A sublayer 216 of titanium is sputtered onto the back side of wafer 100, and a sublayer 218 of aluminum is sputtered over the titanium sublayer 216. For example, titanium sublayer 216 may be 500 Å thick and aluminum sublayer 218 may be 3 $\mu$m thick. Sublayers 216 and 218 are then masked and etched, using conventional photolithographic and etching processes, so that the portions of sublayers 216 and 218 shown in FIGS. 9A and 9B remain. Sections 216G, 218G of sublayers 216, 218 contact the first metal layers 209 in the scribe line area 108, and by means of the first metal layers 209 sections 216G, 218G are in electrical contact with the gate connection pads 106G. Sections 216S, 218S of sublayers 216, 218 contact the first metal layers 209 in the scribe line area 108 and by means of the first metal layers 209 are in electrical contact with the source connection pads 106S. Sections 216D, 218D of sublayers 216, 218 contact the back side of dice 100A and 100B which represent the drain terminals of the MOSFETs. Sections 216G, 218G and 216S, 218S extend over insulating layer 214 on the back side of dice 100A and 100B. Sections 216G, 218G and 216S, 218S and 216D, 218D are electrically insulated from each other.

Figure 10A:
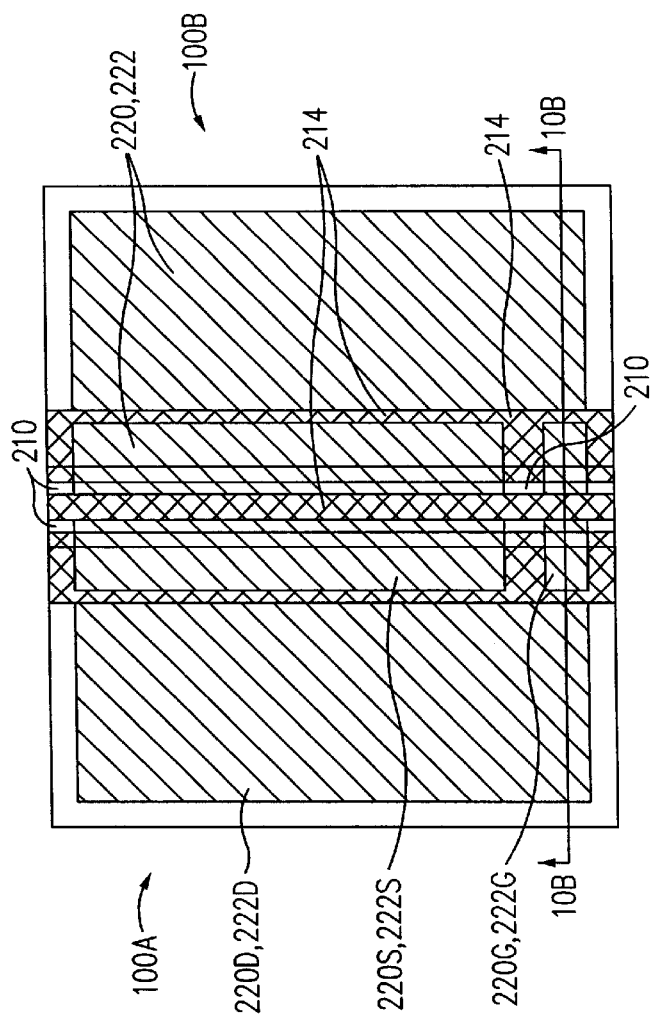
Figure 10B:
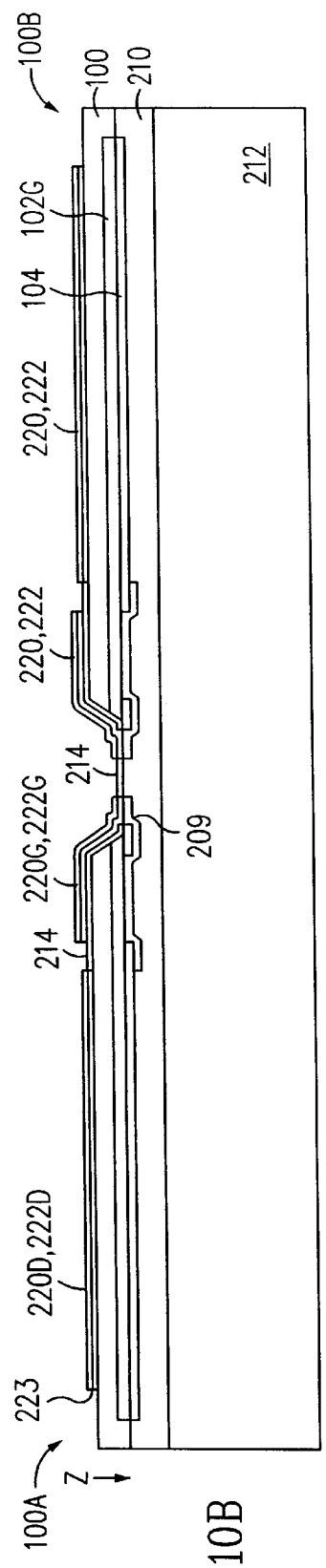

A 10 $\mu$m nickel sublayer 220 is then plated electrolessly onto the top surface of aluminum sublayers 218G, 218S and 218D, and a 0.1 $\mu$m gold sublayer 222 is plated on nickel sublayer 220. The resulting structure is shown in FIGS. 10A and 10B, with sections 220G and 222G of sublayers 220 and 222, respectively, overlying sections 216G, 218G; sections 220S and 222S of sublayers 220 and 222, respectively, overlying sections 216S, 218S; and sections 220D and 222D of sublayers 220 and 222, respectively, overlying sections 216D, 218D.

Together sublayers 216, 218, 220 and 222 in each of dice 100A and 100B form a second metal layer 223. In other embodiments, the second metal layer 223 can include fewer or more than four sublayers, and the sublayers can be deposited by any of the known processes such as sputtering, evaporation, electroless or electrolytic plating, or screen-printing. Sublayers 216, 218, 220 and 222 will sometimes be referred to herein collectively as "second metal layer 223".

Figure 11A:
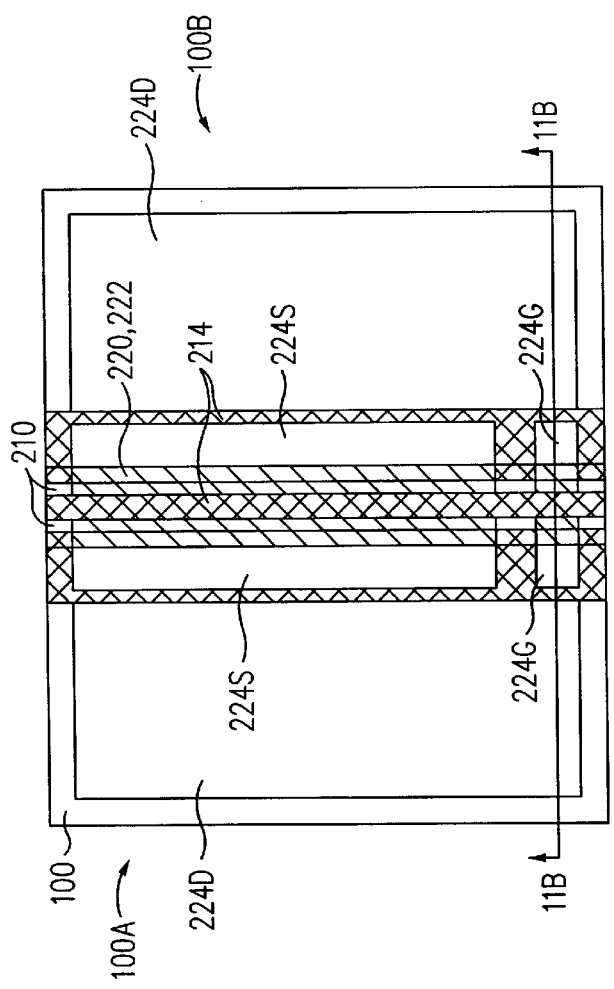
Figure 11B:
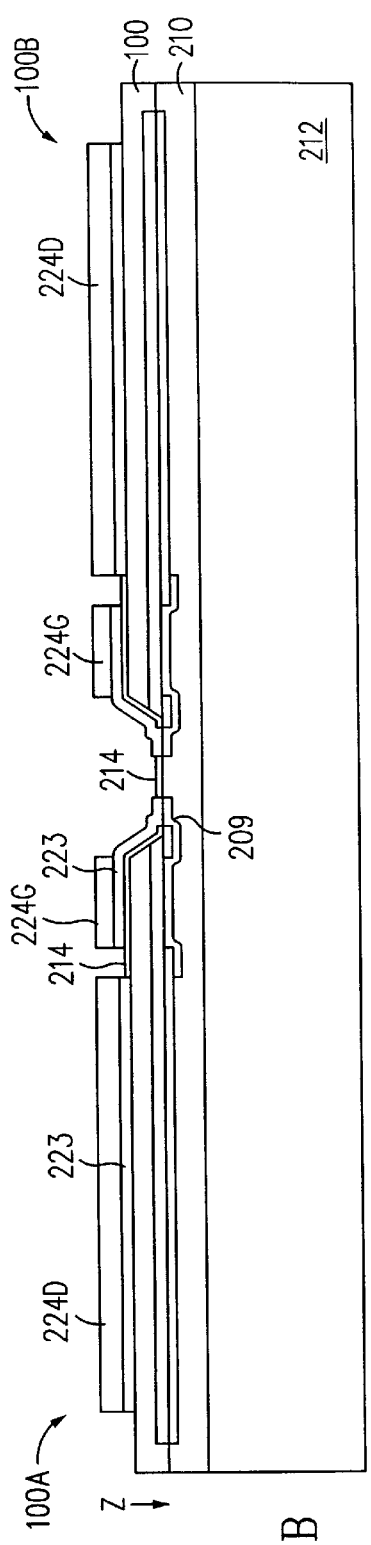

As shown in FIGS. 11A and 11B, solder paste is screen-printed on the second metal layers 224 and then reflowed to form solder posts 224G, 224S and 224D. The solder paste can be 4–5 mils thick. Solder posts 224G, 224S and 224D are electrically insulated from each other. Solder balls, studs, or layers can be used in place of solder posts.

Figure 12A:
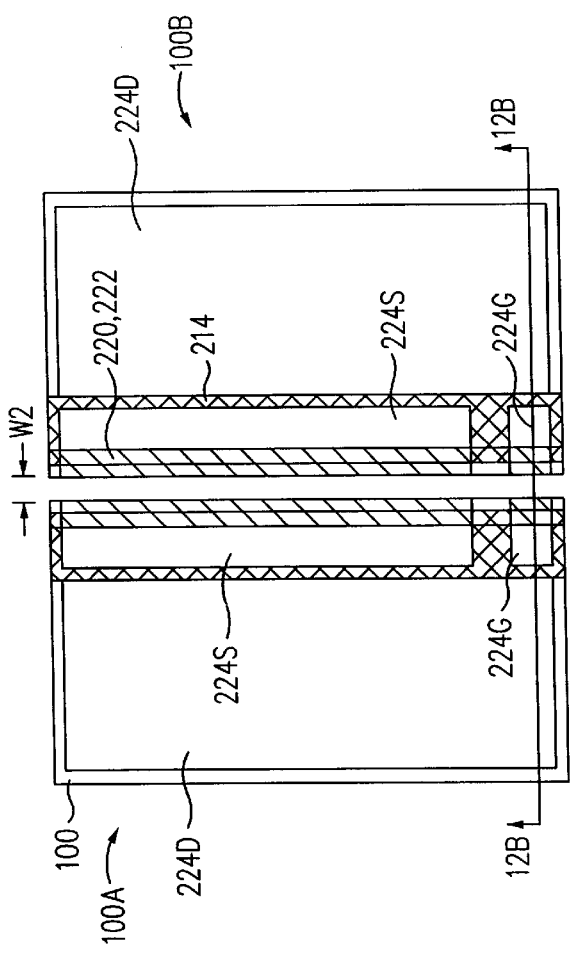
Figure 12B:
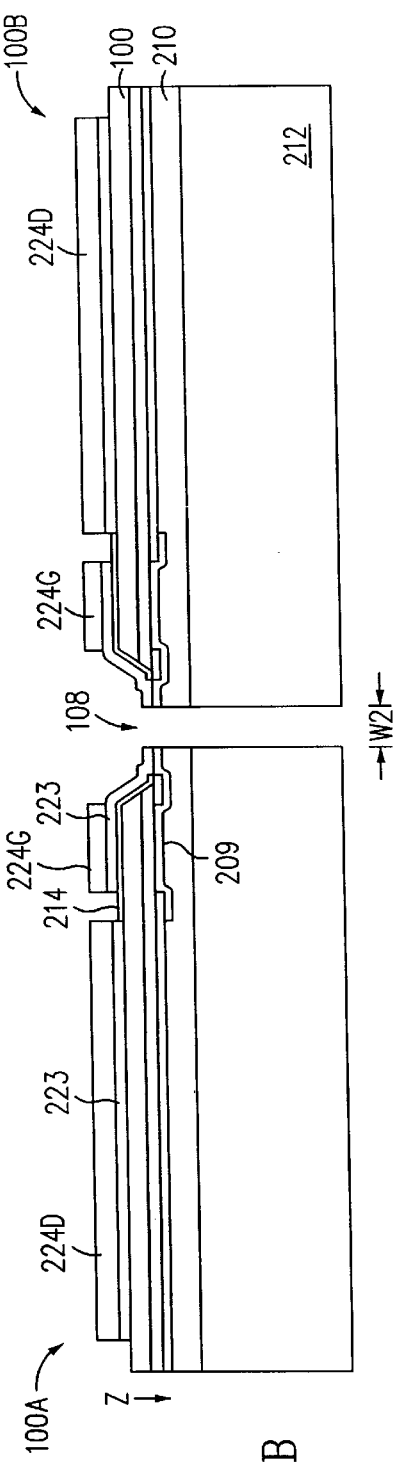

Finally, as shown in FIGS. 12A and 12B, dice 100A and 100B are separated by saw-cutting cap 212 along Y-scribe line 108, preferably in the same direction as the first cut, from the back side to the front side of the dice. The kerf of the cut (W2) is less than W1 so that the portions of the first and second metal layers 209, 223 that extend into the scribe line area are left in place. The dice are also separated along the X-scribe lines 110. As an alternative to saw-cutting, cap 212 can be cut using other known processes such as photolithographic patterning and etching.

Figure 13:
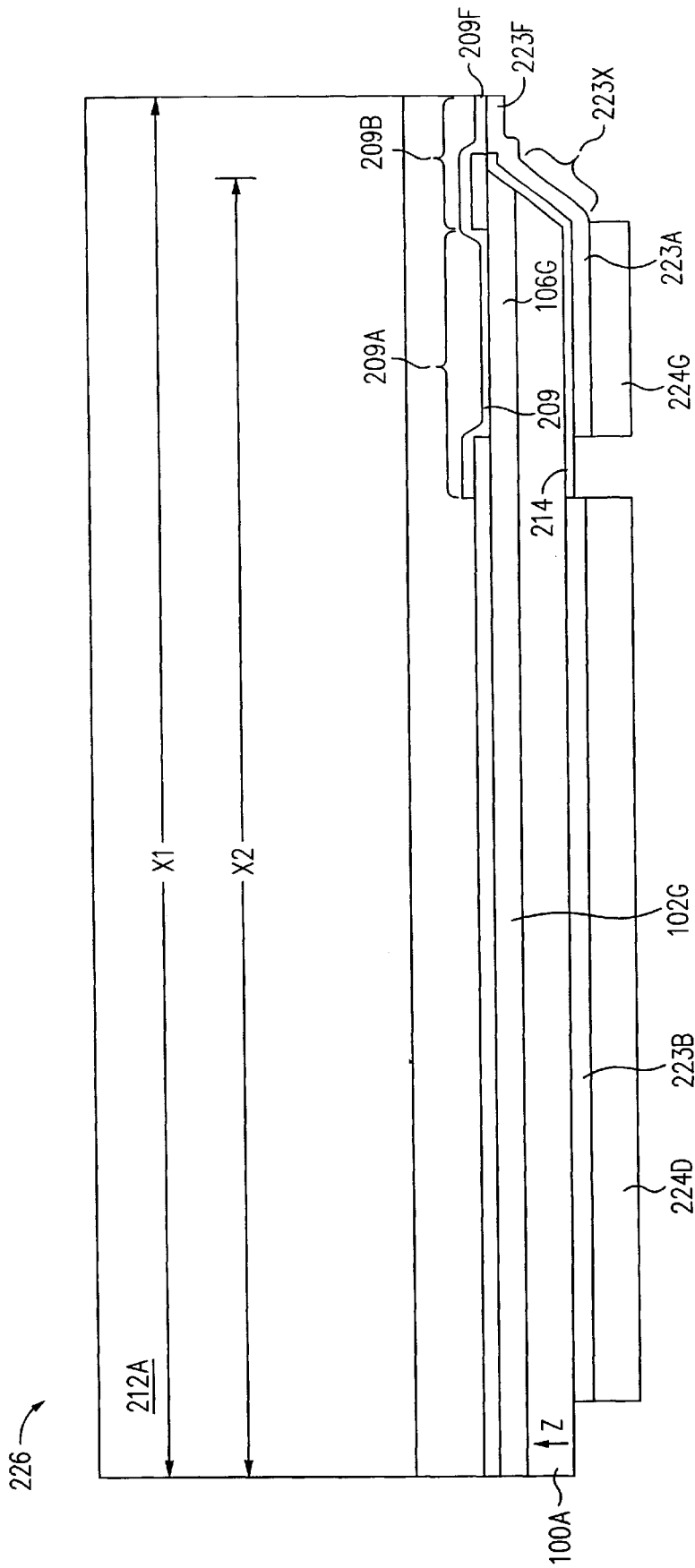
FIG. 13 illustrates a cross-sectional view of a semiconductor package in accordance with this invention.

The resulting semiconductor package 226, including die 100A, is shown in the cross-sectional view of FIG. 13. Package 226 is oriented with a cap 212A over die 100A. As shown, cap 212A has a width X1. Die 100A is attached to cap 212A, with a front side of die 100A facing cap 212A and a back side of 100A die facing away from cap 212A. Die 100A has a width X2 that is less than X1. Connection pad 106G is in electrical contact with the semiconductor device within die 100A. The gate metal layer 102G and gate connection pad 106G are located between die 100A and cap 212A. The first metal layer 209 is in electrical contact with gate connection pad 106G. A first section 209A of the first metal layer 209 is located between gate metal layer 102G and cap 212A, and a second section 209B of the first metal layer 209 extends laterally beyond the edge of gate metal layer 102G. A second metal layer 223 has first and second sections 223A and 223B. The first section 223A of the second metal layer 223 is in contact with the second section 209B of the first metal layer 209 at a location beyond the edge of the die 100A and is insulated from the back side of die 100A by insulating layer 214. The first section 223A of the second metal layer 223 also includes a slanted portion 223X that extends at an oblique angle along the edge of the die 100A. The second section 223B of the second metal layer 223 is in electrical contact with the backside of the die 100A.

It will be apparent that the first metal layer 209 terminates in a first "flange" 209F which extends beyond the edge of the die 100A, and that the second metal layer extends along the edge of the die 100A and terminates in a second "flange" 223F beyond the edge of the die 100A, and that the first and second flanges 209F, 223F are in contact with each other and extend longitudinally outward from die 100A in a direction parallel to the sides of die 100A.

Package 226 can easily be mounted on, for example, a PCB using solder posts 224G and 224D. Solder post 224S is not shown in FIG. 13 but it too would be connected to the PCB so that the source, gate, and drain terminals of the MOSFET would be connected to the external circuitry. The drain terminal is on the back side of die 100A and is electrically connected via section 223B of second metal layer 223. Package 226 contains no wire bonds and, as has been shown, can be manufactured in a batch process using the entire wafer.

Figure 14:
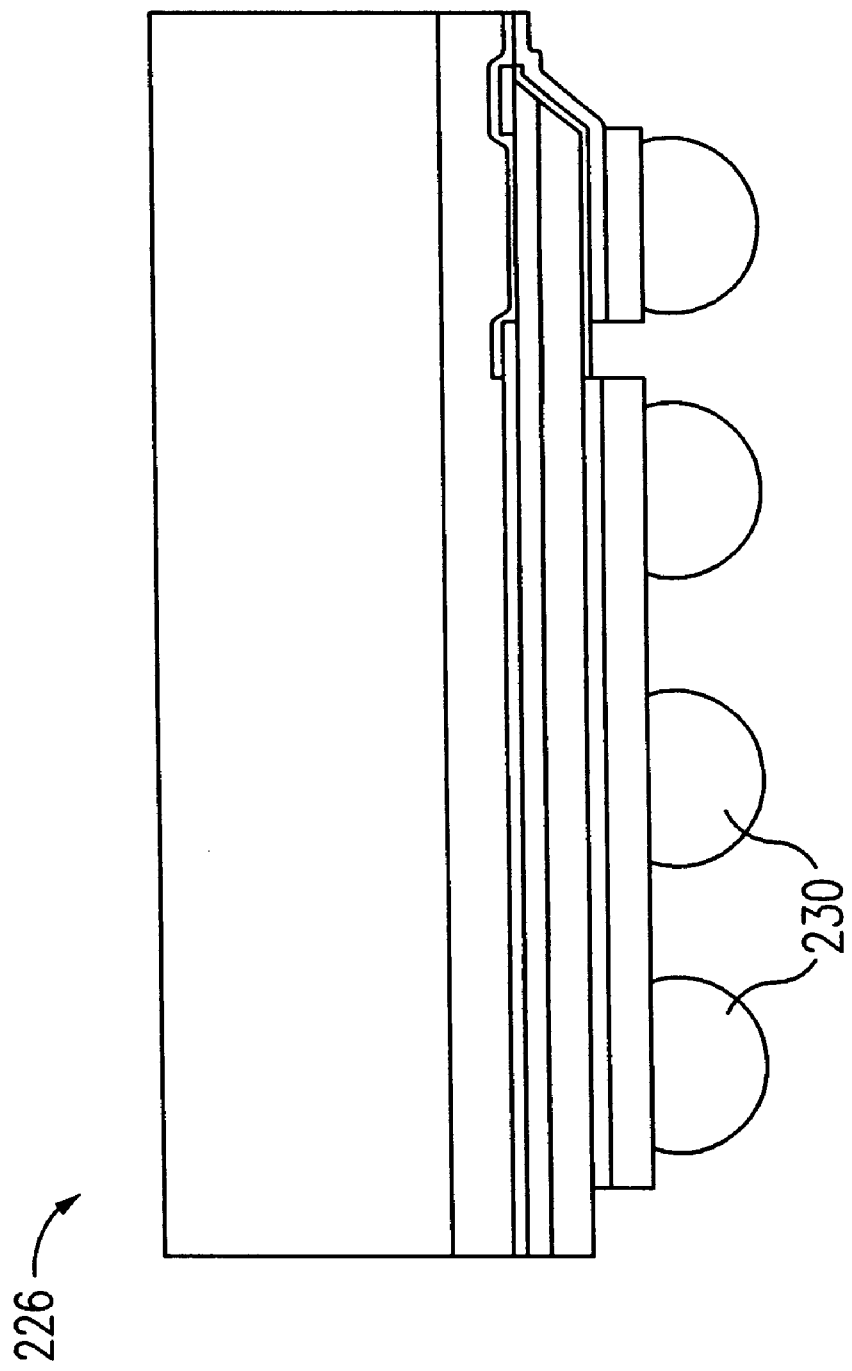
FIG. 14 illustrates an embodiment of the semiconductor package which includes solder balls.

FIG. 14 shows an embodiment of semiconductor package 226 which includes solder balls 230 instead of solder posts. The solder balls may be applied in a conventional manner by depositing and reflowing solder paste or by other processes such as screen-printing or solder jetting (using, for example, equipment available from Pac Tech GmbH, Am Schlangenhorst 15-17, 14641 Nauen, Germany), or by using the wafer level solder ball mounter available from Shibuya Kogyo Co., Ltd., Mameda-Honmachi, Kanazawa 920-8681, Japan. Conductive polymer bumps are another alternative, using for example thermosetting polymers, B-state adhesives, or thermoplastic polymers.

While a specific embodiment of this invention has been described, the described embodiment is intended to be illustrative and not limiting. It will be apparent to those who are skilled in the art that numerous alternative embodiments are possible within the broad scope of this invention.

We claim:

1. A process of fabricating a semiconductor device package comprising:

providing a semiconductor wafer having a front side and a back side and comprising a plurality of dice separated by scribe lines, each die comprising a semiconductor device, a surface of a front side of a die comprising a passivation layer and at least one connection pad in electrical contact with the semiconductor device;

forming a first metal layer in electrical contact with the at least one connection pad, a portion of the first metal layer extending laterally beyond an edge of the die;

attaching a cap to the front side of the wafer;

cutting through the semiconductor wafer from the back side of the wafer in the scribe line area to form a first cut, the first cut having a first kerf W1 and exposing a part of the first metal layer;

forming a nonconductive layer on at least a portion of the back side of the die;

forming a second metal layer, the second metal layer being in electrical contact with the first metal layer and having a first section extending over the nonconductive layer; and cutting through the cap in the scribe line area to form a second cut having a second kerf W2 that is less than the first kerf W1, the second cut leaving in place an area of contact between the first and second metal layers.

2. The process of claim 1 wherein the semiconductor device is a MOSFET and the front side of the die comprises a source connection pad and a gate connection pad, a source portion of the first metal layer being in contact with the source connection pad, a gate portion of the first metal layer being in contact with the gate connection pad, the source and gate portions of the first metal layer being electrically insulated from each other, the first section of the second metal layer being in contact with the source section of the first metal layer, the second metal layer comprising a second section in contact with the gate section of the first metal layer and a third section in contact with a drain terminal on the back side of the die, the first, second and third sections of the second metal layer being electrically insulated from each other.

3. The process of claim 1 wherein forming a first metal layer comprises sputtering a first metal sublayer and sputtering a second metal sublayer on the first metal sublayer.

4. The process of claim 3 wherein the first metal sublayer comprises titanium and the second metal sublayer comprises aluminum.

5. The process of claim 4 wherein forming a first metal layer comprises plating a third metal sublayer on the second metal sublayer.

6. The process of claim 5 wherein the third metal sublayer comprises nickel.

7. The process of claim 6 wherein forming a first metal layer comprises plating a fourth metal sublayer on the third metal sublayer.

8. The process of claim 7 wherein the fourth metal sublayer comprises gold.

9. The process of claim 1 wherein the cap is made of a material selected from the group consisting of glass, plastic, aluminum and copper.

10. The process of claim 1 wherein attaching a cap to the front side of the wafer comprises attaching the cap with a nonconductive adhesive.

11. The process of claim 1 further comprising thinning the semiconductor wafer after attaching a cap to the front side of the wafer.

12. The process of claim 11 wherein thinning the semiconductor wafer comprises grinding the back side of the wafer.

13. The process of claim 11 wherein thinning the semiconductor wafer comprises lapping the back side of the wafer.

14. The process of claim 11 wherein thinning the semiconductor wafer comprises etching the back side of the wafer.

15. The process of claim 11 wherein thinning the wafer comprises making the wafer as thin as is possible without damaging the internal microstructure of the semiconductor devices within the wafer.

16. The process of claim 1 wherein cutting through the semiconductor wafer from the back side of the wafer comprises cutting with a taper saw and etching.

17. The process of claim 1 wherein the first cut does not extend entirely through the first metal layer.

18. The process of claim 1 wherein forming a nonconductive layer on a back side of the die comprises:

depositing a layer of a nonconductive material;

depositing a mask layer on the layer of nonconductive material;

removing a portion of the mask layer to form openings in the mask layer, the openings overlying the second portion of the backside of the die and part of the first metal layer that was exposed by the first cut; and etching the layer of nonconductive material through the openings in the mask layer.

19. The process of claim 1 wherein forming a nonconductive layer on a back side of the die comprises screen-printing.

20. The process of claim 1 wherein forming a second metal layer comprises sputtering a first metal sublayer and sputtering a second metal sublayer on the first metal sublayer.

21. The process of claim 20 wherein the first metal sublayer comprises titanium and the second metal sublayer comprises aluminum.

22. The process of claim 21 wherein forming a second metal layer comprises plating a third metal sublayer on the second metal sublayer.

23. The process of claim 22 wherein the third metal sublayer comprises nickel.

24. The process of claim 23 wherein forming a second metal layer comprises plating a fourth metal sublayer on the third metal sublayer.

25. The process of claim 24 wherein the fourth metal sublayer comprises gold.

26. The process of claim 1 further comprising forming at least one solder post on at least a part of the second metal layer.

27. The process of claim 1 further comprising forming at least one solder ball on at least a part of the second metal layer.

28. The process of claim 27 wherein forming at least one solder ball comprises screen-printing.

29. The process of claim 27 wherein forming at least one solder ball comprises solder jetting.

30. The process of claim 1 further comprising forming at least one conductive polymer ball on at least a part of the second metal layer.

31. The process of claim 1 wherein cutting through the cap comprises sawing.

32. The process of claim 1 wherein cutting through the cap comprises photolithographic patterning and etching.

33. The process of claim 1 further comprising cutting through the wafer and the cap in a direction perpendicular to the first and second cuts to separate the dice.

34. The process of claim 1 wherein the semiconductor device comprises a MOSFET.

35. The process of claim 1 wherein the semiconductor device comprises a diode.

36. The process of claim 1 wherein the semiconductor device comprises a JFET.

37. The process of claim 1 wherein the semiconductor device comprises a bipolar transistor.

38. The process of claim 1 wherein the semiconductor device comprises an IC.

39. A process of fabricating a package for a power MOSFET comprising:

providing a semiconductor wafer having a front side and a back side and comprising a plurality of dice separated by scribe lines, each die comprising a power MOSFET, a surface of a front side of a die comprising a passivation layer, a gate connection pad and a source connection pad, a back side of the die comprising a drain terminal;

forming a front side gate metal layer in electrical contact with the gate connection pad, a portion of the front side gate metal layer extending laterally beyond an edge of the die;

forming a front side source metal layer in electrical contact with the source connection pad, a portion of the front side source metal layer extending laterally beyond the edge of the die, the front side gate and front side source metal layers being electrically insulated from each other;

attaching a cap to the front side of the wafer;

cutting through the semiconductor wafer from the back side of the wafer in the scribe line area to form a first cut, the first cut having a first kerf W1 and exposing a part of the front side gate and front side source metal layers;

forming a nonconductive layer on a portion of the back side of the die, the nonconductive layer leaving uncovered an exposed portion of the front side gate metal layer, an exposed portion of the front side source metal layer, and an exposed portion of a drain terminal of the MOSFET;

forming a back side gate metal layer, the back side gate metal layer extending over the nonconductive layer and electrically contacting the front side gate metal layer in a first area of contact;

forming a back side source metal layer, the back side source metal layer extending over the nonconductive layer and electrically contacting the front side source metal layer in a second area of contact;

forming a back side drain metal layer on the back side of the die in electrical contact with a drain terminal of the MOSFET;

cutting through the cap in the scribe line area to form a second cut having a second kerf W2 that is less than the first kerf W1, the second cut leaving in place the first and second areas of contact; and cutting through the wafer and the cap in a direction perpendicular to the first and second cuts to separate the dice.

40. The process of claim 39 wherein the first cut does not extend entirely through the first and second metal layers.

41. A process for making an electrical connection between a first location on a first side of a semiconductor die and a second location on a second side of the semiconductor die, the process commencing while the die is a part of a semiconductor wafer, the process comprising:

forming a first metal layer extending laterally from the first location on the first side of the die to an area of the wafer beyond an edge of the die;

attaching a cap to the first side of the wafer;

cutting through the semiconductor wafer from the second side of the wafer to expose a part of the first metal layer;

forming a second metal layer extending laterally from the second location on the second side of the die and along an edge of the die to a region of contact with the first metal layer beyond the edge of the die; and cutting through the cap while leaving intact the region of contact between the first and second metal layers.

42. The process of claim 41 comprising forming a nonconductive layer adjacent at least a portion of the second side of the die, wherein a portion of the second metal layer overlies the nonconductive layer.

43. The process of claim 41 wherein cutting through the semiconductor wafer comprises etching the semiconductor wafer to expose the part of the first metal layer.

* * * * *